(12) United States Patent
Francis et al.

(10) Patent No.: US 7,553,690 B2
(45) Date of Patent: Jun. 30, 2009

(54) STARVED SOURCE DIFFUSION FOR AVALANCHE PHOTODIODE

(75) Inventors: Daniel Francis, Oakland, CA (US); Rashit Nabiev, East Palo Alto, CA (US); Richard P. Ratowsky, Berkeley, CA (US); David Bruce Young, Oakland, CA (US); Sunil Thomas, Mountain View, CA (US); Roman Dimitrov, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 59 days.

(21) Appl. No.: 11/151,929

(22) Filed: Jun. 14, 2005

(65) Prior Publication Data

US 2006/0084187 A1 Apr. 20, 2006

Related U.S. Application Data

(62) Division of application No. 10/966,491, filed on Oct. 15, 2004.

(51) Int. Cl.
*H01L 21/00* (2006.01)

(52) U.S. Cl. .............................. 438/91; 438/93; 438/94; 438/57

(58) Field of Classification Search .................... 438/57, 438/61, 91, 93, 94, 98
See application file for complete search history.

(56) References Cited

U.S. PATENT DOCUMENTS 6,015,721 A 1/2000 Kim

OTHER PUBLICATIONS

Y. Liu, et al. "Simple, very low dark current, planar long-wavelength avalanche photodiode", Applied Physics Letters 53(14) Oct. 3, 1988, pp. 1311-1313.

*Primary Examiner*—Jack Chen
*Assistant Examiner*—Matthew Reames
(74) *Attorney, Agent, or Firm*—Workman Nydegger

(57) ABSTRACT

This disclosure is concerned with starved source diffusion methods for forming avalanche photodiodes are provided for controlling an edge effect. In one example, a method for manufacturing an avalanche photodiode includes forming an absorber layer and an avalanche layer over a substrate. Next, a patterned mask defining one or more openings is formed over a surface of the avalanche layer. Finally, a dopant is deposited over the patterned mask and the avalanche layer such that the dopant is blocked by the patterned mask but diffuses into the avalanche layer in areas where the patterned mask defines an opening. The patterned mask is configured such that the depth to which the dopant diffuses into the avalanche layer varies so as to form a sloped diffusion front in the avalanche layer.

21 Claims, 4 Drawing Sheets

STARVED SOURCE DIFFUSION FOR AVALANCHE PHOTODIODE

RELATED APPLICATION

This application is a division, and claims the benefit, of U.S. patent application Ser. No. 10/966,491, entitled STARVED SOURCE DIFFUSION FOR AVALANCHE PHOTODIODE, filed Oct. 15, 2004, and incorporated herein in its entirety by this reference.

BACKGROUND OF THE INVENTION

1. Field of the Invention

The present invention relates to the field of optical communications. More particularly, the present invention relates to the field of avalanche photodiodes.

2. Related Technology

Computer and data communications networks continue to develop and expand due to declining costs, improved performance of computer and networking equipment, the remarkable growth of the internet, and the resulting increased demand for communication bandwidth. Such increased demand occurs within and between metropolitan areas as well as within communications networks. Moreover, as organizations have recognized the economic benefits of using communications networks, network applications such as electronic mail, voice and data transfer, host access, and shared and distributed databases are increasingly used as a means to increase user productivity. This increased demand, together with the growing number of distributed computing resources, has resulted in a rapid expansion of the number of fiber optic systems required.

Through fiber optics, digital data in the form of light signals is formed by light emitting diodes or lasers and then propagated through a fiber optic cable. Such light signals allow for high data transmission rates and high bandwidth capabilities. Other advantages of using light signals for data transmission include their resistance to electro-magnetic radiation that interferes with electrical signals; fiber optic cables' ability to prevent light signals from escaping, as can occur electrical signals in wire-based systems; and light signals' ability to be transmitted over great distances without the signal loss typically associated with electrical signals on copper wire.

In a typical fiber-optic network, the transmission and reception of data is not strictly limited to optical signals, however. Digital devices such as computers may communicate using both electronic and optical signals. As a result, optical signals need to be converted to electronic signals and electrical signals need to be converted to optical signals. To convert electronic signals to optical signals for transmission on an optical fiber, a transmitting optical subassembly (TOSA) is often used. A TOSA uses an electronic signal to drive a laser diode or light emitting diode to generate an optical signal. When optical signals are converted to electronic signals, a receiving optical subassembly (ROSA) is used. The ROSA has a photodiode that, in conjunction with other circuitry, detects optical signals and converts the optical signals to electronic signals. A transceiver is a common device that incorporates both a TOSA and a ROSA.

Photodiodes have a two-electrode, radiation-sensitive junction formed in a semiconductor material in which the reverse current varies with illumination. One common photodiode is the avalanche photodiode (APD). Generally, an APD is a photodiode that internally converts optical signals into electrical signals and then amplifies the electrical signal through avalanche multiplication. APDs are widely recognized as having an increased sensitivity compared to other optical receivers. This is accomplished as a photocurrent gain applied to the devices increases the sensitivity of the device.

In operation, a large reverse-bias voltage is applied across the active region of an APD. For example, a device may have a breakdown voltage between about 40 volts and about 70 volts for InP based APDs, and up to thousands of volts for Si based devices. Each photon from an optical signal impinging the absorber layer generates an electron-hole pair or a carrier, generating an additional current. When the device's reverse-bias voltage nears breakdown level, the hole-electron pairs collide with ions and/or the crystal lattice to create additional hole-electron pairs, thus achieving a signal gain. This voltage causes the electrons/holes initially generated by the incident photons to accelerate as they move through the APD active region. An avalanche layer in the APD is designed such that one carrier causes an avalanche of other carriers where the number of other carriers is dependent on the gain of the APD. To obtain a desired response from an optical signal, the device may be biased only about 5%-10% below the breakdown level so that the device has great sensitivity to optical power.

FIG. 1 illustrates one step in forming a typical APD. While APD structures vary greatly in form and methods of production, FIG. 1 provides a good background for the present discussion of APDs. As depicted, APD 100 includes avalanche layer 102 having a diffusion region 104 therein. Underneath avalanche layer 102 is a charge layer 108. Underneath charge layer 108 is absorber layer 110, which in turn is over substrate 112. A bottom electrode 114 and a top electrode (not depicted), which are oppositely charged, apply a voltage across the APD. The charge layer 108 helps moderate the electrical field.

The avalanche layer 102 may be formed of a material such as, for example, InP. The avalanche layer 102 is where the electrons/holes initially generated by the incident photons accelerate and multiply as they move through the APD active region. The diffusion region 104 is formed in the center region of avalanche layer 102 with an implanted dopant material, for example zinc, to form, for example, a p+ InP diffusion region 104. As depicted by mask 106, the diffused area of the diffusion region is a direct result of the position of the mask 106. The absorber layer 110 is formed on a substrate 112. As the name implies, the absorber layer is where an optical signal is absorbed.

The process of fabricating InP/InGaAs photodiodes, and APDs in particular, involve at least one diffusion step to form diffusion region 104, and other subsequent steps to control edge gain. Edge gain results from the fact that the electric field is higher at the edges of an APD active region, which roughly has slightly less depth than at the center. Illustrated in FIG. 2 is a cross section of the detected signal strength in an APD. The illustrated peaks correspond to the signal strength at the edge of the APD while the encompassed trough indicates the signal strength at the center of the APD. It can be clearly seen how the signal strength at the edges of the APD is much higher than at the center. This is because the outer region of the detector has a higher responsivity, or ratio of current output to light input, than the center region. By the time the gain in the center achieves an optimal value, the gain at the edges is much higher and causes high level of dark current and edge breakdown limiting the device performance. The edge breakdown is a phenomenon known also as an edge effect.

Additionally, edge effect results from the fact that detectors only provide fast response in their center region despite the higher responsivity at the edges. Thus, the response time, or the time needed for the photodiode to respond to optical inputs and produce and external current, can be affected by edge effect if the APD is focused on the edge rather than the center. This can be a large issue since high edge responsivity can cause problems when aligning an optical fiber to the detector. For example, the higher responsivity on the edge can mislead a user into thinking they have aligned the fiber to the center region when they have actually improperly aligned the fiber to the APD. Because response time is much slower at the edge, however, this misalignment will reduce the response time of the detector. In addition, a misaligned APD will primarily receive impingent photons from an optical fiber on the edge, rather than the center. This is particularly disadvantageous because the center has faster response time, the edge has greater problems with noise, and not all of an optical signal launched by an optical fiber may reach the corresponding APD.

Conventional methods of forming APDs have taken various approaches to controlling the edge effect. For example, some conventional methods use double diffusion. Such methods include forming a first wide mask and then doping. Those skilled in the art will appreciate that "doping" involves the addition of a particular type of impurity in order to achieve a desired n-conductivity or p-conductivity. The first mask is removed and a second, narrower mask is deposited and a deeper doping is performed. This method controls edge effect by creating a thinner diffusion region at the edge, increasing the distance from the diffusion region at the edge to the underlying charge layer, thus reducing the responsivity. Another conventional method known in the art for controlling the edge effect is the etching of curved surfaces prior to diffusion.

Each of these methods, however, as well as others known in the art but not mentioned herein, requires multiple steps to form a diffusion region. Such additional steps raise the cost of forming avalanche photodiodes. In addition, such complicated methods are difficult to control in fabrication processes, often resulting in a low yield.

Accordingly, it would represent an advance in the art to provide a more straightforward method with fewer steps to control the edge effect.

BRIEF SUMMARY OF AN EXEMPLARY EMBODIMENT OF THE INVENTION

The present invention offers an improvement over the prior art by providing a simpler, more reliable method for controlling the edge effect in avalanche photodiodes (APDs). According to the invention, the edge effect is controlled by reducing edge gain near the edges of the active region. This is accomplished by creating a sloped diffusion front near the edges of the active region such that the distance between a diffusion region and the absorber layer below it is increased. This reduces the responsivity of the edge.

The sloped diffusion front is advantageously formed in a single doping step by using a patterned mask. The patterned mask only partly covers regions of the underlying avalanche region, which results in a lesser dopant diffusion in partly covered areas than in uncovered areas. As a result, the diffusion depth can be controlled as desired through pattern design, and a sloped diffusion front can thereby be formed in the region underlying the pattern.

As suggested by the foregoing, one exemplary embodiment of the invention concerns a method for producing an avalanche photodiode. This exemplary method generally includes: forming an absorber layer, a charge layer, and an avalanche layer over a substrate; forming a mask over a surface of the avalanche layer such that the surface of the avalanche layer comprises: a center region wherein no mask is present; an outer region covered entirely by the mask; and a transition region extending from the outer region to the center region such that the mask covers more of surface of the avalanche region closer to the outer region and less of the surface of the avalanche region closer to the center region. Finally, the method also includes depositing a dopant over the mask and the avalanche layer, wherein the dopant is blocked by the mask and diffuses deeper in regions of the surface of the avalanche layer where less mask is present such the deposited dopant forms a sloped diffusion front in the avalanche layer.

In one embodiment of the invention, the mask pattern which forms the sloped diffusion front includes a series of concentric rings having gaps between adjacent rings. The concentric rings and/or the gaps therebetween have varying widths such that the gaps cover a greater surface area closer to the active region and a lesser surface area closer to the edge.

These and other aspects of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EXEMPLARY EMBODIMENTS

The present invention relates to starved source diffusion methods for controlling the edge effect in avalanche photodiodes (APDs). In general, edge effect is a phenomenon where the edges of a diffusion region in the active region of an APD have a higher responsivity, or ratio of current output to light input, than the center of the APD. As a result of this phenomenon, a user or automated process aligning an APD to an optical fiber often misaligns the APD, mistaking the edge of the APD for the center.

According to the invention, the edge effect is controlled by reducing edge gain near the edges of the active region. This is accomplished by creating a sloped diffusion front near the edges of the active region such that the distance between a diffusion region and the charge layer below it is increased. In other words, a thicker avalanche layer is created, increasing the edge gain and reducing the responsivity of the edge.

The sloped diffusion front is advantageously formed in a single doping step by using a patterned mask. Whereas conventional masks used in doping steps in forming APDs have a solid exterior and an opening over the active region, embodiments of the invention provide a transition region where the underlying avalanche region is only partly covered. As a result, the diffusion depth can be controlled as desired through pattern design. A sloped diffusion front can thereby be formed in the region underlying the pattern. In preferred embodiments of the invention the pattern comprises a series of narrow concentric rings.

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

In the following description, numerous specific details are set forth in order to provide a thorough understanding of the present invention. It will be obvious, however, to one skilled in the art that the present invention may be practiced without these specific details. In other instances, well-known aspects of optoelectronic systems have not been described in particular detail in order to avoid unnecessarily obscuring the present invention.

Figure 3:
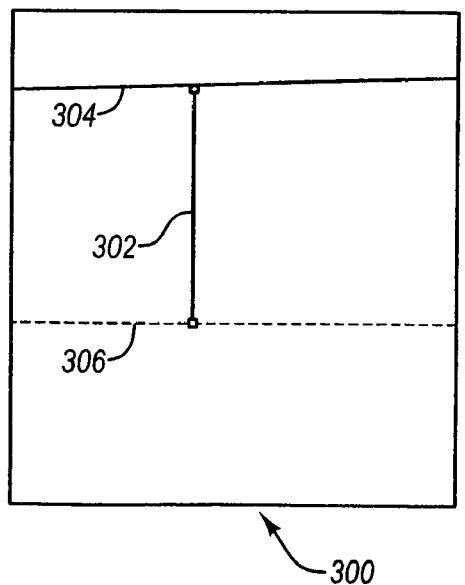
FIG. 3 illustrates the diffusion depth in an unmasked avalanche layer.
Figure 4:
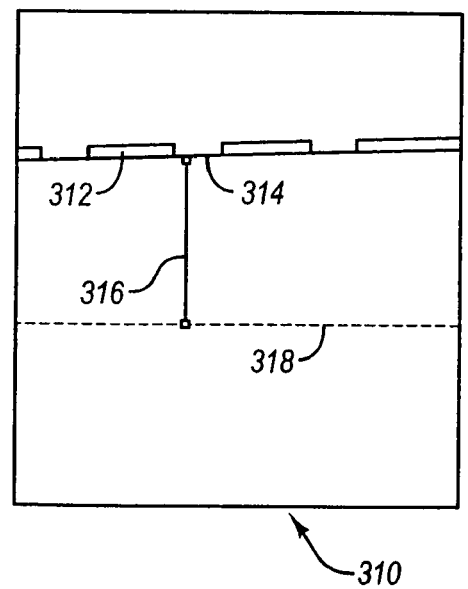
FIG. 4 illustrates the diffusion depth in a masked avalanche layer resulting from a starved diffusion process according to one embodiment of the invention.

Referring now to FIG. 3, an unmasked avalanche layer 300 after doping is depicted. As indicated by line 302, the depth from the surface 304 of the avalanche layer 300 to the diffusion front 306 is 2.92 µm. By way of comparison, FIG. 4 illustrates a masked avalanche layer 310 after doping has been performed. In this case, however, according to the invention a patterned mask 312 has been formed on the surface 314 of the avalanche layer 310. As indicated by line 316, the distance from the surface 314 of the avalanche layer 310 to the diffusion front 318 is now only 2.34 µm. The patterned mask has effectively reduced the diffusion depth from 2.92 µm to 2.34 µm.

Generally, masks serve as a barrier to selected dopants. Masks can be formed by depositing a layer of suitable mask material, such as silicon oxide or silicon nitride. The mask material can then be etched using photolithography or liftoff methods, for example, to form the desired pattern. Further details for the above method, as well as other methods for forming masks, are well known in the art and are not discussed herein in greater detail in order to avoid obscuring the invention.

Figure 5:
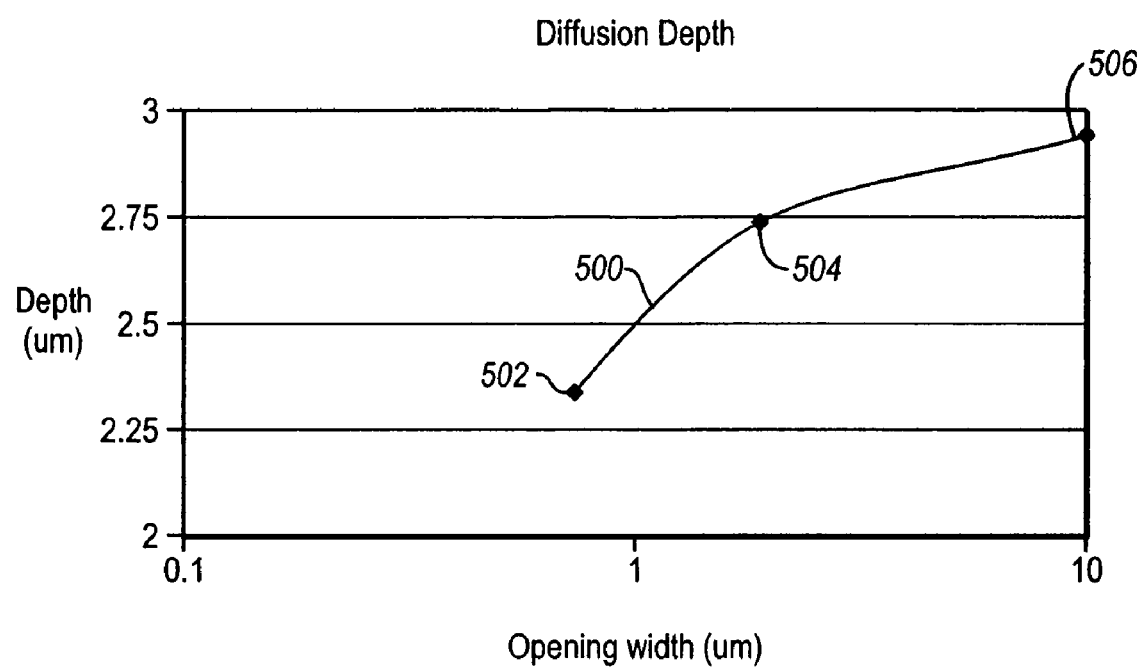
FIG. 5 illustrates a plot of opening width versus diffusion depth for a variety of different opening widths in mask patterns according to embodiments of the invention.

With reference to FIG. 5, the diffusion depth can be effectively and reproducibly controlled by changing the opening widths in the patterned mask. In FIG. 5, the graph shows the mask opening width (µm) along the x axis and the diffusion depth (µm) along the y axis. Line 500 plots the depth of diffusion depth for a series of different opening widths. For example, point 502 shows that for an opening width of about 0.9 µm, the diffusion depth is about 2.35 µm. Point 504 shows that for an opening width of about 3 µm, the diffusion depth is about 2.75 µm. Finally, point 506 shows that for an opening width of about 10 µm, the diffusion depth is about 2.9 µm. By comparison with FIG. 3, it is evident that by the time the opening width reaches 10 µm, the diffusion depth is not significantly limited. This information allows a designer to effective choose a desired diffusion depth by controlling opening sizes in a mask.

Figure 6:
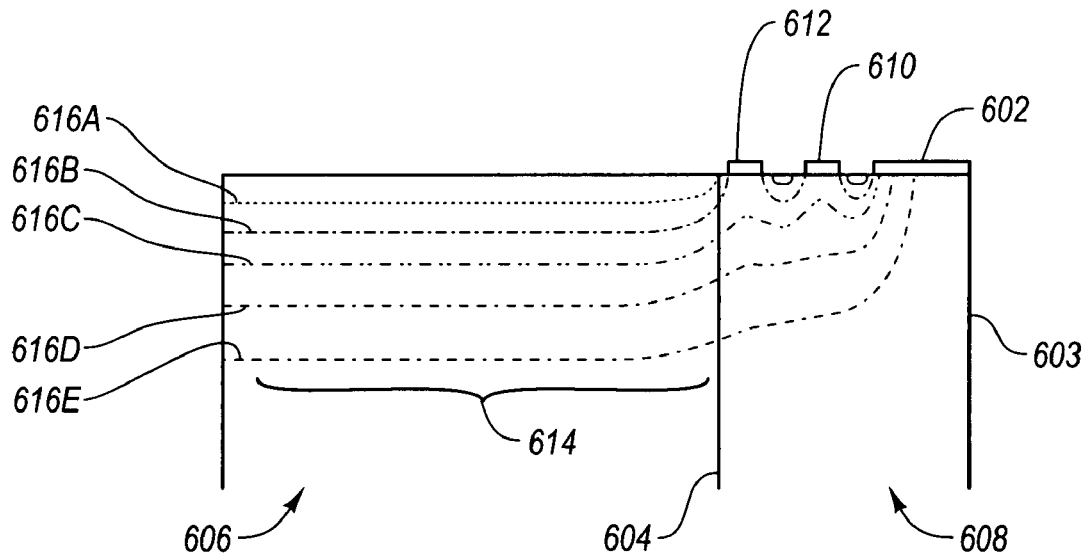
FIG. 6 illustrates a flat diffusion front in the absence of a patterned mask according to the prior art.

Referring now to FIG. 6, modeling of the diffusion front for a standard APD is depicted. In the illustration, a mask 602 is depicted over an avalanche layer 603 into which dopants have diffused. For ease in discussing the invention, edge line 604 has been added to figuratively denote the edge between the active region 606 of the device and outer region 608. As is standard in the art, concentric mask rings 610, 612 are present in the portion of the outer region 608 just outside the edge line 604 in order to assist in the formation of floating guard rings. See Y. Liu et al, *Simple, Very Low Dark Current, Planar Long-Wavelength Avalanche Photodiodes*, Appl. Phys. Lett. 53 (14) (Oct. 3, 1998), incorporated herein by reference. Floating guard rings do not contact the junction in the active region. Rather, the floating guard rings help avoid premature edge breakdown by having a potential that is at a value somewhat less than that established by an externally applied voltage.

Notably in FIG. 6, diffusion lines 616A-616E denote various concentrations of dopants diffused into the underlying layer. By way of example, the concentrations may gradually reduce from $1e^{18}$ at diffusion line 616A to $1e^{16}$ at diffusion line 616E. Notably, the diffusion lines 616A-616E have a flat diffusion front 614 in the active region 606.

Figure 7:
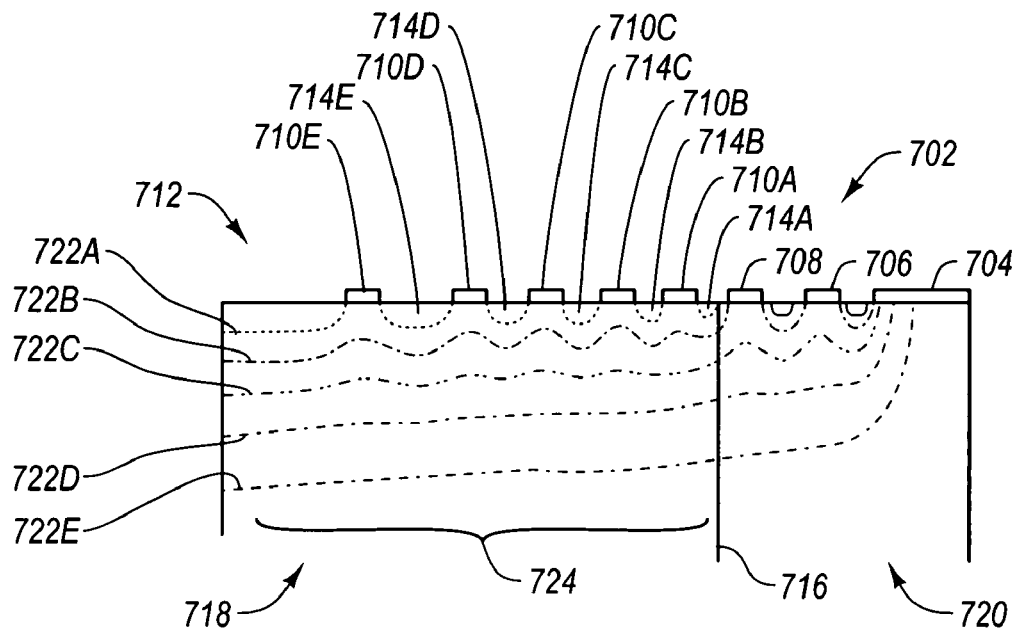
FIG. 7 illustrates a sloped diffusion front under a patterned mask according to one embodiment of the invention.

Referring now to FIG. 7, modeling of the diffusion front for an APD according to the invention is depicted. In this illustration, a patterned mask 702 consists of an outer mask region 704, floating concentric mask rings 706, 708, and concentric patterned rings 710A-710E. A center region 712 is defined by the patterned mask 702. The patterned rings 710A-710E and concentric mask ring 708 define a series of openings 714A-714E. For ease in discussing the invention, edge line 716 has been added to figuratively denote the edge between the active region 718 of the device and outer region 720.

As illustrated in FIG. 7, diffusion lines 722A-722E denote various concentrations of dopants diffused into the underlying multiplication layer. By way of example, the concentrations may gradually reduce from $1e^{18}$ at diffusion line 722A to $1e^{16}$ at diffusion line 722E. In contrast to the flat diffusion front 614 for a conventional APD, the diffusion front in FIG. 7 is a sloped diffusion front 724. As a result, within the active region 718, the distance between the diffusion layer and an underlying charge layer is greater closer to edge line 716 than it is in the center of the active region. This reduces the edge gain of the device, which in turn increases the breakdown voltage at the edge and reduces the responsivity of the edge region. As previously noted, a more consistent responsivity throughout an APD junction helps reduce alignment errors.

A number of patterns can be used to create a mask pattern such as patterned mask 702. For example, the mask pattern can include a series of concentric rings, such as patterned rings 710A-710E. Alternatively, any number of other mask patterns can be used, so long as they serve to reduce the edge gain. Preferably, the pattern will involve a series of narrow lines, or other narrow patterns, so that a smooth diffusion front will result from the more even diffusion.

Referring now to the embodiment depicted in FIG. 7, openings 714A-714E between concentric rings are preferably not evenly sized. Rather, opening 714E, which is closest to the active region is preferably much larger than opening 714A, which is closer to the edge. In one embodiment, the sizes of openings 714A-714E will gradually increase in size from less than 1 µm to 10 µm or greater. In another embodiment, the sizes of opening will also vary, but with an upper limit of about 1.5 µm. Another pattern approach could be to maintain equally sized openings, but at varying densities. In other words, the width of patterned rings 710A-710E can vary while the size of the openings 714A-714E is held constant rather than the width of patterned rings 710 being held constant while the size of the openings 714A-714E is varied. Of course, the widths of both the openings 714A-714E and the patterned rings 710 can be varied as well.

Figure 1:
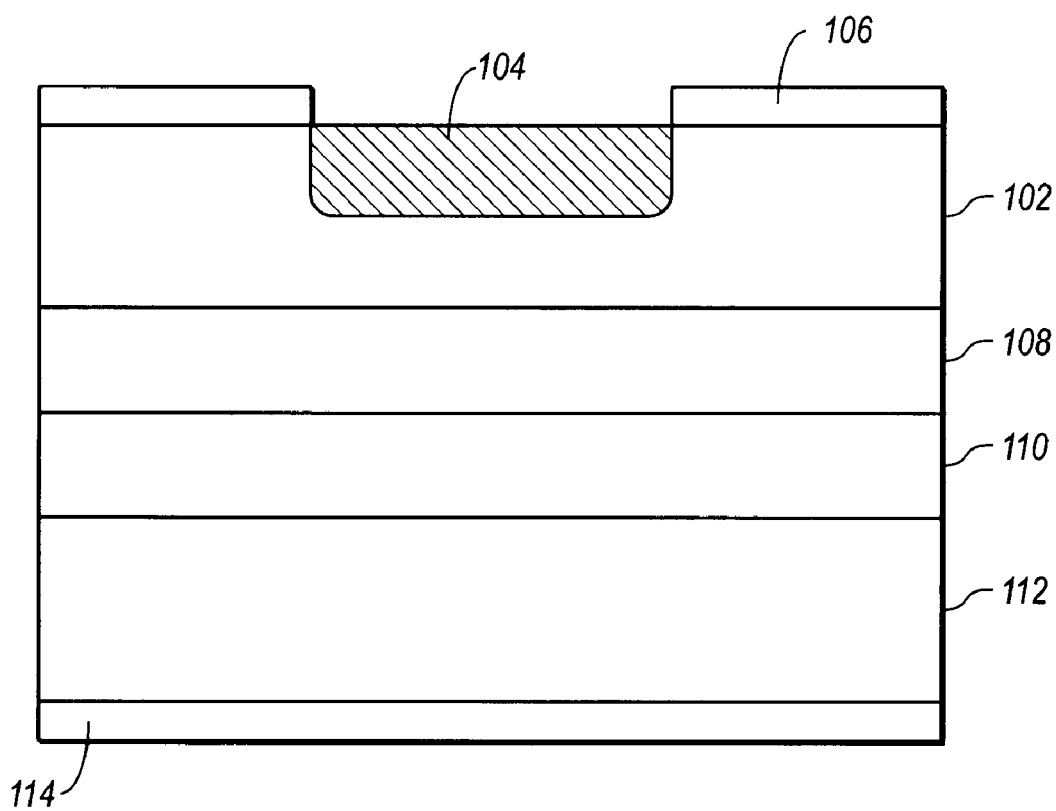
FIG. 1 illustrates the structure of a conventional avalanche photodiode.
Figure 2:
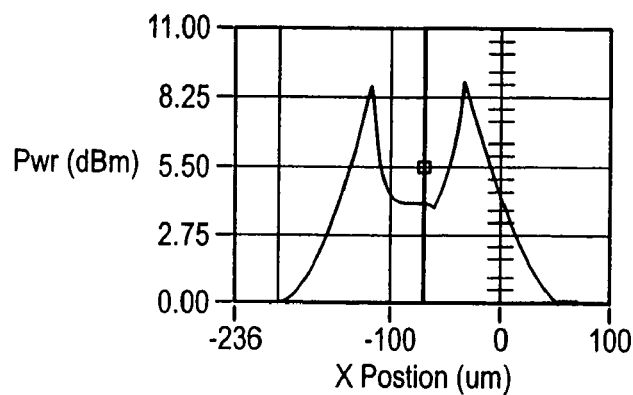
FIG. 2 illustrates a two-dimensional plot of a cross section of photodiode intensity, demonstrating that edge gain is higher nearest the edges of the active region of an avalanche photodiode.

In addition to the diffusion region overlying an avalanche region as indicated above, APDs according to the invention include other layers. For example, typical APDs include an opposing pair of oppositely charged electrodes so that a voltage can be provided across the APD, thereby increasing the sensitivity of the device since less power must be provided by an optical signal to achieve breakdown. For example, an APD can have a p-electrode on the top surface of the APD and an n-electrode on the bottom of the APD. These electrodes are used to apply the operating voltage across the APD so that it operates at nearly its breakdown voltage. It is this high-voltage characteristic of APDs that increases their sensitivity over typical PIN photodiodes. A charge layer such as charge layer 108 in FIG. 1 may also be used for improved control of the electric field profile. The active region of an APD includes a light-absorbing region or layer adjacent to an avalanche region or layer. A dielectric film or antireflective coating may be formed over the active region on the surface where light first contacts the APD.

Accordingly, one example APD structure according to the invention includes an InGaAs absorber layer formed over a substrate. The substrate may be, for example, an n+ InP substrate formed over an n-electrode. An InP charge layer may then be formed over the absorber layer. An InP avalanche, or multiplication, layer may then be formed over the InP charge layer. Within the InP avalanche layer, a p+ diffusion region having a sloped diffusion front is formed as disclosed hereinabove. The dopant forming the diffusion region is preferably zinc, although other compatible dopants may be used.

Various embodiments of the invention include both receiver optical subassemblies (ROSAs) and transceivers incorporating APDs according to the invention. Such devices will have a lower cost and greater efficiency by incorporating the novel APDs as disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for manufacturing an avalanche photodiode, comprising:
    forming an absorber layer and an avalanche layer over a substrate, the avalanche layer including a centrally located active region having an outer edge;
    forming a patterned mask over a surface of the avalanche layer, the patterned mask including a plurality of floating concentric mask rings;
    forming a plurality of substantially concentric patterned rings inside, and substantially concentric with, an innermost floating mask ring such that the patterned rings and the innermost floating mask ring collectively define a plurality of openings, and the outer edge of the active region being positioned between the innermost floating mask ring and an outermost patterned ring;
    forming a charge layer beneath the avalanche layer; and
    depositing a dopant over the patterned mask, patterned rings and the avalanche layer such that the dopant diffuses into the avalanche layer in areas where an opening is defined, and the floating mask rings, and patterned rings being configured such that the depth to which the dopant diffuses into the avalanche layer varies so as to form a sloped diffusion front in the active region, and the sloped diffusion front including a plurality of diffusion lines, one of which is substantially linear and has a non-zero slope in the active region, and the substantially linear diffusion line extending from the outer edge of the active region to a center of the active region.

2. The method as recited in claim 1, wherein the sloped diffusion front extends into a region adjoining the active region.

3. The method as recited in claim 1, wherein a distance from the sloped diffusion front to a layer beneath the avalanche layer is relatively less in a central portion of the active region than at a peripheral portion of the active region.

4. The method as recited in claim 1, wherein substantially all of the diffusion front is non-horizontal.

5. The method as recited in claim 1, wherein some openings are relatively closer to the active region of the avalanche photodiode than other openings, and the openings varying in size such that openings relatively closer to the active region are larger than openings relatively further away from the active region.

6. The method as recited in claim 1, wherein each opening has a width in a range of about 0.5 μm to about 10 μm.

7. The method as recited in claim 1, wherein the plurality of patterned rings comprises at least three rings.

8. The method as recited in claim 1, wherein the plurality of patterned rings comprises at least five concentric rings.

9. The method as recited in claim 1, wherein the absorber layer comprises InGaAs and the avalanche layer comprises InP.

10. The method as recited in claim 9, wherein the dopant comprises zinc.

11. The method as recited in claim 1, wherein deposition of the dopant is performed in a single step.

12. The method as recited in claim 1, wherein dopant diffusion depths are achieved by controlling opening sizes in the patterned mask.

13. The method as recited in claim 1, wherein one of the following sets of widths is substantially constant: widths of the rings; and, widths of the openings.

14. The method as recited in claim 1, wherein one of the following sets of widths varies: widths of the rings; and, widths of the openings.

15. A method for manufacturing an avalanche photodiode, comprising:
    forming an absorber layer, a charge layer, and an avalanche layer over a substrate, the avalanche layer including a centrally defined active region having an outer edge;
    forming a plurality of substantially concentric patterned rings over a surface of the avalanche layer such that the patterned rings collectively define a plurality of open portions;
    forming a patterned mask over a surface of the avalanche layer, the patterned mask including a plurality of floating concentric mask rings arranged such that an outermost patterned ring is positioned within an innermost floating mask ring and wherein at least one open portion is cooperatively defined by a floating mask ring and a patterned ring, the outer edge of the active region being positioned between the outermost patterned ring and the innermost floating mask ring, and the floating mask rings being configured and arranged such that the following regions are defined on the surface of the avalanche layer:
        a center region aligned with an open portion;

an outer region substantially covered by one or more unopen portions; and a transition region extending from the outer region to the center region such that the portion of the surface area of the avalanche layer that is covered by unopen portions is relatively greater proximate the outer region than proximate the center region; and depositing a dopant over the mask and the avalanche layer such that the dopant is substantially blocked in the outer region, substantially unblocked in the center region, and partially blocked in the transition region, the dopant in the transition region having a diffusion depth that varies such that the deposited dopant forms a sloped diffusion front that slopes substantially continuously from a center of the active region of the avalanche layer into a region adjacent to the edge of the active region and the sloped diffusion front including a plurality of diffusion lines, one of which is substantially linear and has a non-zero slope in the active region.

16. The method as recited in claim 15, wherein some openings are relatively closer to the active region of the avalanche photodiode than other openings, and the openings varying in size such that openings relatively closer to the active region are larger than openings relatively further away from the active region.

17. The method as recited in claim 15, wherein the space between each concentric ring has a width in a range of about 0.5 μm to about 10 μm.

18. The method as recited in claim 15, wherein the absorber layer comprises InGaAs and the avalanche layer comprises InP.

19. The method as recited in claim 18, wherein the dopant comprises zinc.

20. The method as recited in claim 15, wherein at least one of the following has non-uniform widths: the concentric rings; and, the openings between the concentric rings.

21. The method as recited in claim 15, wherein a distance from the sloped diffusion front to the charge layer is relatively less in a central portion of the active region than at a peripheral portion of the active region.

\* \* \* \* \*

UNITED STATES PATENT AND TRADEMARK OFFICE
CERTIFICATE OF CORRECTION

| | | |
|---|---|---|
| PATENT NO. | : 7,553,690 B2 | Page 1 of 1 |
| APPLICATION NO. | : 11/151929 | |
| DATED | : June 30, 2009 | |
| INVENTOR(S) | : Francis et al. | |

It is certified that error appears in the above-identified patent and that said Letters Patent is hereby corrected as shown below:

On the Title Page
Abstract, Item (57), in the second line the word "are" after "photodiodes" should be changed to --that are--

Column 1
Line 42, change "electrical" to --with electrical--

Column 2
Line 61, change "level" to --levels--

Column 4
Line 4, change "of" to --of the--

Signed and Sealed this

Twenty-third Day of February, 2010

David J. Kappos
*Director of the United States Patent and Trademark Office*